US011031349B1

(12) United States Patent
Janssens (10) Patent No.: US 11,031,349 B1
(45) Date of Patent: Jun. 8, 2021

(54) METHOD OF FORMING A SEMICONDUCTOR DEVICE AND CURRENT SENSING CIRCUIT THEREFOR

(71) Applicant: SEMICONDUCTOR COMPONENTS INDUSTRIES, LLC, Phoenix, AZ (US)

(72) Inventor: Johan Camiel Julia Janssens, Asse (BE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/857,674

(22) Filed: Apr. 24, 2020

(51) Int. Cl.
| | |
|---|---|
| *H01L 29/36* | (2006.01) |
| *H01L 29/06* | (2006.01) |
| *H01L 29/861* | (2006.01) |
| *H01L 29/66* | (2006.01) |
| *H01L 23/556* | (2006.01) |
| *H01L 23/00* | (2006.01) |

(52) U.S. Cl.
CPC .......... *H01L 23/556* (2013.01); *H01L 23/576* (2013.01)

(58) Field of Classification Search
CPC . H01L 29/66136; H01L 29/36; H01L 23/576; H01L 23/556
See application file for complete search history.

(56) References Cited

U.S. PATENT DOCUMENTS

| | | | |
|---|---|---|---|
| 10,026,728 B1* | 7/2018 | Agam | ................ H01L 29/1095 |
| 2009/0108311 A1 | 4/2009 | Liu | |
| 2009/0113357 A1 | 4/2009 | Abadeer et al. | |
| 2010/0127314 A1 | 5/2010 | Frach | |
| 2010/0230772 A1 | 9/2010 | Cannon et al. | |
| 2012/0286144 A1* | 11/2012 | Holz | .................. H01L 27/1446 250/214.1 |
| 2015/0048459 A1 | 2/2015 | Marinet et al. | |
| 2016/0104781 A1* | 4/2016 | Janssens | ............. H01L 29/0657 257/655 |
| 2019/0043856 A1* | 2/2019 | Agam | ................ H01L 29/7391 |

\* cited by examiner

*Primary Examiner* — Omar F Mojaddedi
(74) *Attorney, Agent, or Firm* — Robert F. Hightower (57) ABSTRACT

In one embodiment, a method of forming a semiconductor device may include forming a sensing circuit to apply a voltage to a doped region wherein the voltage expands depletion region toward a second depletion region but substantially does not intersect the second depletion region. An embodiment may include configuring the sensing circuit to detect electrons within the doped region and to responsively assert a detection signal representing detection of the electrons wherein the sensing circuit detects the electrons while applying the voltage to the second doped region.

14 Claims, 6 Drawing Sheets

METHOD OF FORMING A SEMICONDUCTOR DEVICE AND CURRENT SENSING CIRCUIT THEREFOR

BACKGROUND

The present invention relates, in general, to electronics, and more particularly, to semiconductors, structures thereof, and methods of forming semiconductor devices.

Advances in the semiconductor industry allowed for smaller device sizes and structures and facilitated forming large numbers of functional circuits on a single semiconductor device or semiconductor chip. The functional circuits included large numbers of analog circuits or digital circuits or power devices formed on a single semiconductor die. Because of the reduced sizes of the semiconductor devices, the operation of the circuits could be vulnerable to external influences. For example, alpha particles or photons from external to the semiconductor device could create currents within the semiconductor device and result in improper operation. Some applications for semiconductor devices, such as automotive and avionics applications, required a high reliability. In some cases, it was difficult for the smaller semiconductor devices to achieve the desired reliability.

Accordingly, it is desirable to have a semiconductor device with small sizes that has increased reliability, that can detect the presence of external influences, and/or that can indicate the detection of the external influences.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

The embodiments illustrated and described hereinafter may have embodiments and/or may be practiced in the absence of any element which is not specifically disclosed herein.

DETAILED DESCRIPTION

Figure 1:
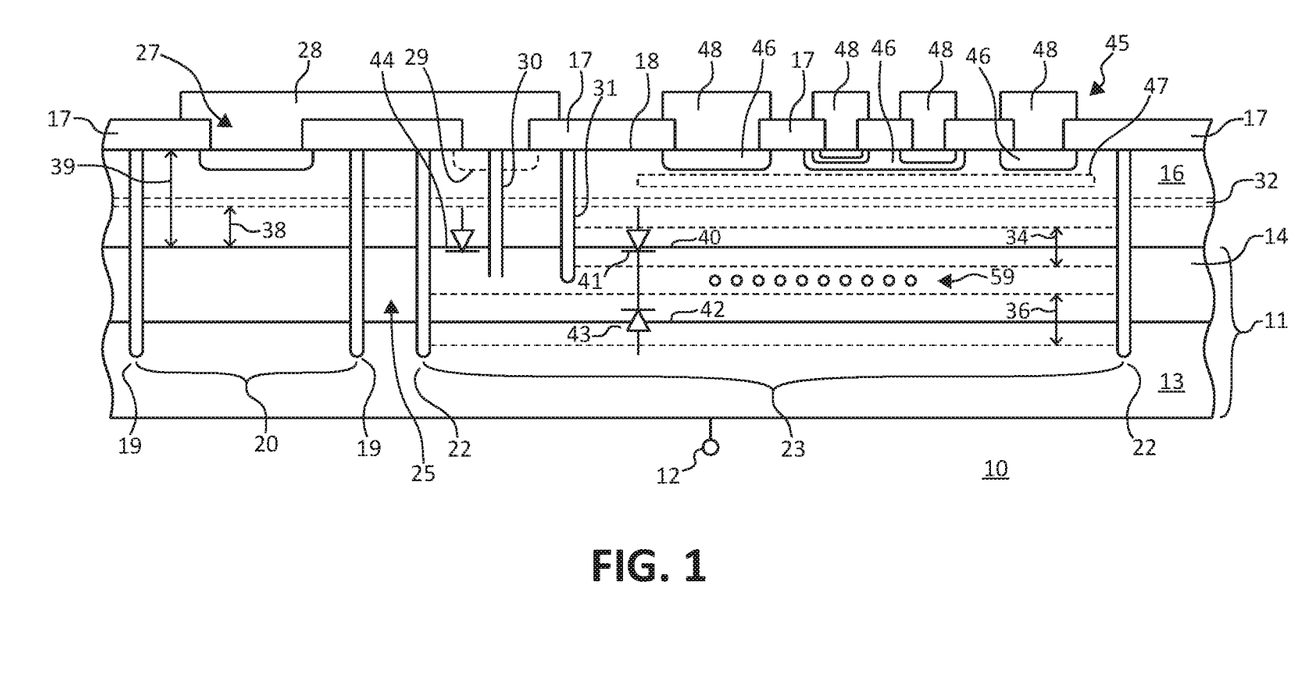
FIG. 1 illustrates an enlarged cross-section of an example of an embodiment of a portion of a semiconductor device that includes a protection/detection circuit in accordance with the present invention.

FIG. 1 illustrates an enlarged cross-section of an example of an embodiment of a portion of a semiconductor device 10 that includes a protection/detection circuit or detect circuit 27. Device 10 also includes functional circuits 45 that may be formed on a first portion of device 10. Device 10 may include various types of analog, digital, or power devices and circuits. For example, functional circuits 45 may include various digital logic circuits including logic gates, flip-flops, counters, and other types of functional circuitry including analog circuits such as op amps, transconductance amplifiers, comparators, and other types of analog circuits. The circuit elements of circuit 45 may be formed as CMOS circuits, BiCMOS circuits, bipolar circuits, power circuits, or other types of well-known circuit elements.

Device 10 includes a semiconductor substrate 11 that has a doped region 16. An embodiment of device 10 may be formed to include an electrical connection 12 to substrate 11. In an embodiment, functional circuits 45 may be formed on a portion of doped region 16. Semiconductor substrate 11 may have an embodiment that may include a bulk semiconductor substrate 13 that has a doped layer or doped region 14. In an embodiment, substrate 13 may be omitted. For example, substrate 13 may be removed during the process of forming device 10. Doped region 14 may be an epitaxial layer that is formed on substrate 13 or may be a portion of substrate 13 that is doped with a different dopant type. In an embodiment, substrate 13 may have a P-type conductivity and region 14 may have an N-type conductivity. Thus, a P-N junction 43 (illustrated by a diode) may be formed along an interface 42 between region 14 and substrate 13. A depletion region 36, illustrated by dashed lines, may be formed near interface 42 and to extend into substrate 13 and region 14. An embodiment of substrate 13 may have a dopant concentration that is much greater than the dopant concentration of region 14, or greater than at least a portion of region 14 that is near interface 42.

A doped layer or doped region 16 may be formed on region 14 or may be formed as a portion of region 14 that has a different dopant type. For example, region 16 may be an epitaxial layer that is formed on region 14 or may be a portion of region 14 that is doped with a different dopant type. An embodiment of region 16 may be formed as a P-type conductivity. Thus, a P-N junction 41 (illustrated by a diode) may be formed along an interface between regions 14 and 16. An embodiment may include that region 16 may have a dopant concentration that is less than the dopant concentration of substrate 13. For example, substrate 13 may have a dopant concentration in the range of approximately 4E18 atoms/cm$^3$ to approximately 1E19 atoms/cm$^3$, some embodiments may be greater than 1E19 atoms/cm$^3$. Region 16 may have a dopant concentration in the range of approximately 1E15 atoms/cm$^3$ to approximately 1E16 atoms/cm$^3$, some embodiments may be greater than 1E16 atoms/cm$^3$. Region 16 may also have an embodiment that may have a graded dopant concentration. For example, the dopant concentration may be lower near interface 40 and the dopant concentration may increase in a direction through region 16 that is substantially perpendicular to interface 40. An embodiment may include that region 16 may have one or more layers of higher doping concentration adjacent to layers of lower dopant concentration such as a region 32, illustrated by dashed lines, that has a higher dopant concentration than the portion of region 16 that is between region 32 and interface 40. For example, region 32 may be formed as a boron doped layer. In some embodiments, the boron layer contains a Boron-10 isotope. In some embodiments, doped region 32 may have a dopant concentration in a range from approximately 1E16 atoms/cm3 to approximately 1E18 atoms/cm3. In one embodiment, doped region 32 has a dopant concentration of approximately 7E16 atoms/cm3. A depletion region 34, illustrated by a dashed lines, may be formed near interface 40 and extend into regions 14 and 16. Those skilled in the art will appreciate that circuits 45 may also have a depletion region 47, illustrated by a dashed box, underlying circuits 45. For example, some of the implementations of circuits 45 may be formed in doped regions 46 or wells having a different dopant type than region 16, thus, may have depletion region 47 underlying the wells. Region 16 has a surface 18 that is on a side of region 16 that is opposite to, or alternately facing oppositely to, substrate 11. Region 16 has a thickness 39 along a line that is substantially perpendicular to interface 40. An embodiment of region 32 may be positioned a distance 38 from interface 40 wherein distance 38 is along a line that is substantially perpendicular to interface 40. Distance 38 is less than thickness 39. An embodiment of region 14 may be formed with a dopant concentration that is less than the dopant concentration of region 16 or of region 32.

Device 10 also may be formed to include active regions 20 and 23 in which active semiconductor elements, such as for example functional circuits 45 and circuit 27, are formed. An isolation trench 22 is formed to extend from surface 18 through region 16, through region 14, and into substrate 13. Trench 22 is formed to encircle a perimeter of a first portion of regions 14 or 16 that are within region 23. Trench 22 is formed as an isolation trench that has an insulator at least on the interior sidewalls of trench 22. An embodiment may also include that trench 22 also has an insulator on the bottom, such as for example along the portion that extends laterally across substrate 13. Similarly, a trench 19 is formed to extend from surface 18 through region 16, through region 14, and into substrate 13. Trench 19 is formed to encircle a perimeter of a second portion of regions 14 or 16 that are within region 20. Trenches 19 and 22 are formed to encircle a perimeter of respective portions of regions 14 and 16 that are within respective active regions 20 and 23. Thus, trench 22 forms a multiply-connected domain with active region 23 on the interior of the multiply-connected domain. Similarly, trench 19 forms another multiply-connected domain with active region 20 on the interior of the multiply-connected domain. The sidewalls of trench 19 are adjacent to the perimeter of region 20 and the sidewalls of trench 22 are adjacent to the perimeter of region 23. Functional circuits 45 are formed in active region 23, and circuit 27 is formed in active region 20. Those skilled in the art will appreciate that region 20 is external to and spaced laterally apart from region 23. For example, another portion 25 of regions 16 and 14 may be interposed laterally between trenches 19 and 22, thus, between regions 20 and 23. In some embodiments, region 25 may be omitted and the trench 19 that is close to trench 22 may actually abut trench 22. Alternately, trench 22 may replace trench 19 that is near trench 22, thus the second active region 20 may be bounded by trench 22 on at least one side and by trench 19. (For example, see dashed lines 49 in FIG. 3) Those skilled in the art will also appreciate that "multiply-connected topology" or "multiply-connected domain" or "multiply-connected" means a class of connected shape(s) or domain(s) that have an opening or hole through the shape, such as for example a doughnut having a doughnut hole through the middle of the doughnut. The periphery of the shape can be circular or a parallelogram or any other shape including an ellipse or an irregular shape (Also see FIG. 3 and the description thereof). An insulator 17 may electrically isolate some of the elements of device 10 from other elements.

Although circuit 27 is formed in active region 20, circuit 27 is directly connected electrically to region 14 within active region 23 through conductors or conductor elements. In an embodiment, device 10 may include that circuit 27 is connected to region 14 through region 16. For example, device 10 may include a doped region 29 (illustrated by dashed lines) within region 23 that forms a low resistance ohmic connection to the material of region 16 Circuit 27 could be electrically connected to region 14 through a P-N junction, illustrated by a diode 44, at the interface between regions 14 and 16. Circuit 27 is also electrical connected to a conductor 28 that extends from region 20 to region 23 and makes an electrical connection to trench 30. Circuits 45 may also include conductors 48 used to make electrical connection between the elements of circuits 45 or to other circuits (not shown) in other portions of region 23. For example, circuit 27 may be configured to apply a voltage that forward biases diode 44. For such an embodiment, device may include an isolation trench 31 that extends from surface 18 through region 16 and into region 14. In an embodiment, trench 31 may extend through the depletion region of diode 41. Trench 31 may be positioned laterally between circuits 45 and region 29 to allow current flow through from region 14 to region 29 but to substantially prevent current flow to region 29 through region 16.

An embodiment of device 10 may be formed to include a conductor trench 30 within active region 23. Trench 30 extends from surface 18 through region 16 to electrically contact region 14, or alternately extends into region 14. An embodiment of trench 30 may have an insulator on the sidewalls but not on the bottom, and may be filled with a conductor material that makes a low resistance ohmic connection to the material of region 14.

An alternate embodiment of device 10 may include a conductor region (not shown) within region 16 that forms an ohmic connection to region 14. For example, a portion of region 16 may be doped with the same dopant type as region 14 so that the conductor region extends from surface 18, through region 16 to at least abut region 14. Some embodiments of such a conductor region may be referred to in the art as a "sinker" region or "sinker". During the operation of device 10, it is possible that alpha particles or other external influences can impinge on region 14 and create free electrons 59. Electrons 59 may be formed in any region of device 10 including within region 16 and region 14. Some of the external influences that assist in generation of electrons 59 could cause improper operation of device 10. However, as will be seen further hereinafter, circuit 27 is configured to detect the presence of electrons 59. An embodiment of device 10 may be configured to detect the presence of the external influence by detecting the presence of electrons 59. Device 10 may have an embodiment that may be configured to form electrons 59 within the portion of region 14 that is within region 23. In an embodiment, device 10 may be configured to collect electrons 59 within the portion of region 14 that is within region 23. For example, cause electrons 59 to flow within the portion of region 14 that is within region 23. An embodiment of circuit 27 may have an input impedance greater than approximately one hundred thousand (100K) ohms. An embodiment of circuit 27 may also be configured to form a detect signal in response to detecting electrons 59. An embodiment may include forming circuit 27 to apply a voltage to a portion of region 14, such as for example the portion within region 23, wherein the voltage expands depletion region 34 toward depletion region 47 so that region 34 substantially does not intersect region 47. An embodiment may also include forming circuit 27 to, while the voltage is applied, detect electrons 59 formed within region 14 and to responsively assert a detection signal representing detection of the electrons. In response to the detect signal, circuits 45 may be configured to reduce the operational effect of the external influences or alternately the influence of electrons 59. For example, in response to the detect signal, circuits 45 could be configured to suspend operation or alternately to reset operation. For example, circuits 45 may be configured to modify the supply voltage of the functional circuits. Circuits 45 may alternately be configured to reset some of the logic circuits, such as flip-flops, or memory circuits, or otherwise change a state of the circuits. Circuits 45 may alternately be configured to change the logic value of one or more outputs of circuit 45. An embodiment may include forming circuit 27 to detect electrons generated in regions underlying the functional circuits. An embodiment of circuit 27 may be configured to compare a current formed by electrons 59 to a threshold value. An embodiment may include configuring circuit 27 to indicated detection of the current having a value greater than a threshold value. An embodiment may include configuring circuit 27 to indicate a difference between two such currents having a value greater than a threshold value.

Figure 2:
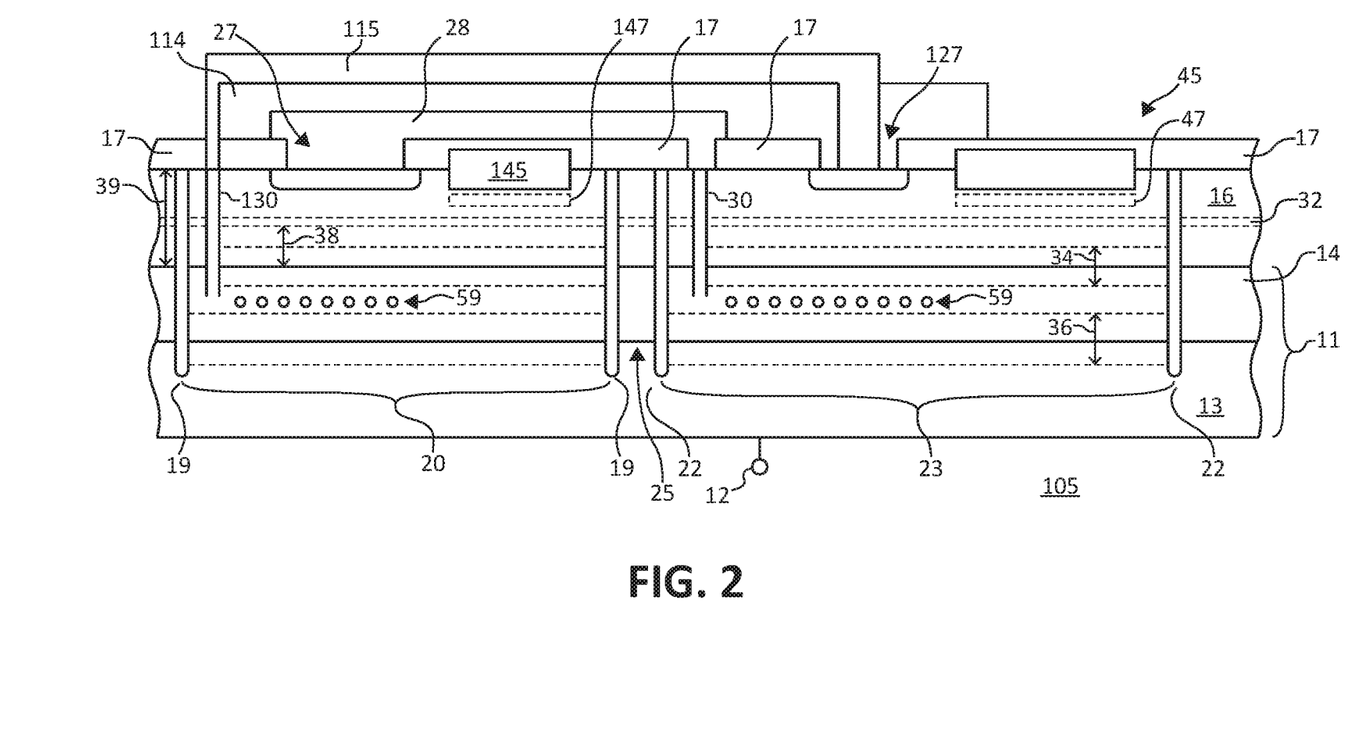
FIG. 2 illustrates an enlarged cross-section of an example of an embodiment of a portion of a semiconductor device that may have an embodiment that may be an alternate embodiment of the device of FIG. 1 in accordance with the present invention.

FIG. 2 illustrates an enlarged cross-section of an example of an embodiment of a portion of a semiconductor device 105 that may have an embodiment that may be an alternate embodiment of device 10 (FIG. 1). Device 105 is substantially the same as device 10 except that device 105 includes a protection/detection circuit or detect circuit 127 that is formed in region 23, and also includes functional circuits 145 that are formed in region 20. Circuit 127 is formed in region 23 substantially similarly to circuit 27, and circuits 145 are formed in region 20 substantially similarly to circuits 45. An embodiment of device 105 may also include an additional conduction trench 130 formed in region 20 wherein trench 130 is formed to be substantially the same as trench 30 except that it is positioned within region 20. Device 105 may also include an insulator 114, and a conductor 115 that forms a connection between circuit 127 and the portion of region 14 that is in region 20. Circuit 127, formed in region 23, detects electrons 59 that are formed in the portion of region 14 within region 20 similarly to circuit 27 that detects electrons 59 that are formed in the portion of region 14 that is within region 23.

Figure 3:
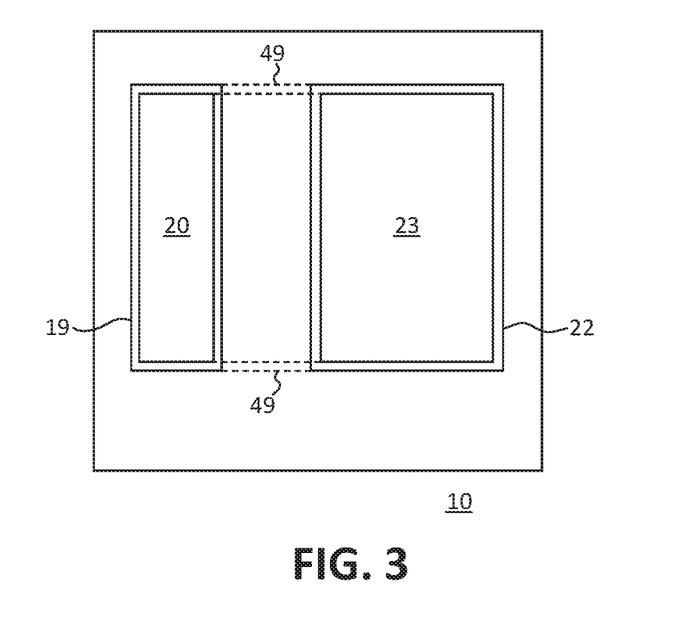
FIG. 3 illustrates an enlarged plan view of an example of a portion of the device of FIG. 1 or FIG. 2 in accordance with the present invention.

FIG. 3 illustrates an enlarged plan view of an example of a portion of device 10 or alternately device 105. Trench 19 is formed as a continuous trench that encircles region 23, and trench 22 is formed as a continuous trench that encircles region 20. For example, trench 19 encircles a vertical portion of an outside perimeter of region 20, and trench 22 encircles a vertical portion of an outside perimeter of region 23. In an embodiment, a portion of trench 22 may form one of the boundaries of region 20 as illustrated by dashed lines 49. Although trenches 19 and 22 are illustrated as parallelograms, trenches 19 and 22 can have various other geometric configurations including circles, ellipses, hexagons, or other geometrical shapes. Those skilled in the art will appreciate that trench 22 is configured to prevent lateral current flow through either of regions 14 or 16 to elements external to active region 23, such as to elements in active region 20. Similarly, trench 19, or alternately trench 19 and a portion of trench 22, is configured to prevent lateral current flow through either of regions 14 or 16 to elements external to active region 20, such as to elements in active region 23.

Figure 4:
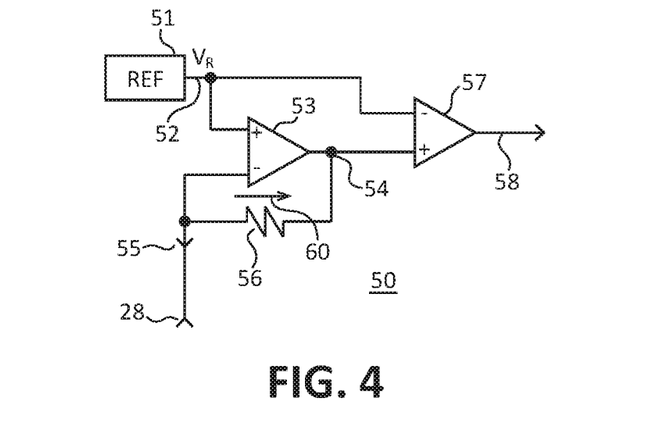
FIG. 4 schematically illustrates a portion of an example of an embodiment of a protection/detection circuit that may have an embodiment that may be an alternate embodiment of either or both of the circuits of FIG. 1 or 2 in accordance with the present invention.

FIG. 4 schematically illustrates a portion of an example of an embodiment of a protection/detection circuit or detect circuit 50 that may have an embodiment that may be an alternate embodiment of either or both of circuits 27 or 127 (FIG. 2). An embodiment of circuit 50 may function as a regulator circuit that is configured to apply a voltage to region 14 and to detect a sense voltage responsively to a current 55 formed by electrons 59 that are created in region 14. An embodiment of circuit 50 may have an input impedance greater than approximately one hundred thousand (100K) ohms. The high input impedance assists circuit 50 in sensing small numbers of electrons 59, thus small values of current 55. Circuit 50 includes an amplifier 53, a reference voltage generator circuit or reference circuit or Ref circuit 51, and a resistor 56. Amplifier 53 receives a reference voltage ($V_R$) 52 from circuit 51 and forms an output signal 54 that attempts to keep the inverting input of amplifier 53, thus conductor 28 and region 14, at voltage $V_R$ 52. Electrons 59 from region 14 form current 55 flowing from the output of amplifier 53 through resistor 56 to conductor 28 and the portion of region 14 in region 23. Current 55 forms a sense voltage 60 across resistor 56. Sense voltage 60 decreases the voltage at the negative input of amplifier 53 which increases signal 54 and allows amplifier 53 to absorb electrons 59 as current 55 that flows into conductor 28 to region 14. Thus, current 55 causes the value of signal 54 to become $V_R$+ (I55*R56). Where I55 is the value of current 55 and R56 is the value of resistor 56. Consequently, circuit 50 detects electrons 59 as the increase value of signal 54. Circuit 50 may optionally include a comparator 57 which asserts signal 58 on the output of comparator 57 in response to signal 54 increasing in value to greater than voltage $V_R$ 52. A different reference voltage, instead of voltage $V_R$ 52, may be received by comparator 57 in other embodiments. For an embodiment that includes diode 44, the value of the voltage applied to region 14 may be $V_R$-V44 where V44 is the voltage drop across diode 44.

In order to assist in providing the hereinbefore described functionality for circuit 50, an output of circuit 51 is connected to a non-inverting input of amplifier 53. An inverting input of amplifier 53 is commonly connected to conductor 28, and to a first terminal of resistor 56. A second terminal of resistor 56 is connected to the output of amplifier 53. Optional comparator 57 may have an inverting input connected to the output of circuit 51. A non-inverting input of comparator 57 may be connected to the output of amplifier 53. An output of comparator 57 is configured to form signal 58.

Figure 5:
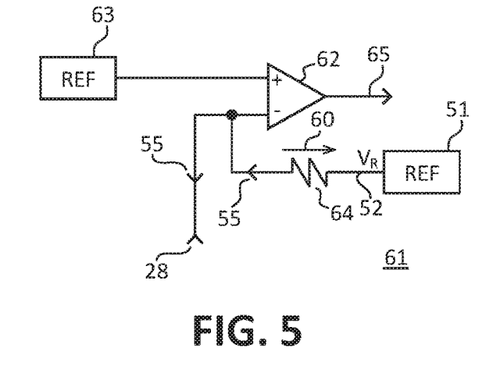
FIG. 5 schematically illustrates a portion of an example of an embodiment of a protection/detection circuit that may have an embodiment that may be an alternate embodiment of any one of the circuits of FIG. 1-2 or 4 in accordance with the present invention.

FIG. 5 schematically illustrates a portion of an example of an embodiment of a protection/detection circuit or detect circuit 61 that may have an embodiment that may be an alternate embodiment of any one of circuits 27, 127, or 50. Circuit 61 includes a comparator 62, a reference generator circuit 63, a resistor 64, and circuit 51. Circuit 61 applies voltage $V_R$ 52 to region 14 through resistor 64 and conductor 28. For the embodiment that includes diode 44, the voltage applied to region 14 may be $V_R$-V44. Comparator 62 compares the voltage from circuit 63 to the voltage applied to conductor 28. In response to electrons 59, circuit 51 forms current 55 flowing from circuit 51 through resistor 64 to conductor 28 and region 14. Current 55 flowing through resistor 64 forms sense voltage 60 across resistor 64. Sense voltage 60 reduces the voltage on the inverting input of comparator 62 causing comparator 62 to assert detect signal 65 on the output of comparator 62. An embodiment of circuit 61 may be configured to assert signal 65 in response to current 55 forming the on the inverting input of comparator 62 to be less than the voltage from circuit 63. Thus, circuit 61 asserts detect signal 65 in response to detecting electrons 59 within region 14. In an embodiment, circuit 61 may be configured to detect current 55 having a value that causes voltage 60 to be greater than a difference between the voltage from circuit 63 and voltage $V_R$ 52.

In order to assist in providing the hereinbefore described functionality for circuit 61, a non-inverting input of comparator 62 is connected to the output of circuit 63. An inverting input of comparator 62 is commonly connected to conductor 28 and to a first terminal of resistor 64. A second terminal of resistor 64 is connected to the output of circuit 51. The output of comparator 62 is configured to form detect signal 65.

Figure 6:
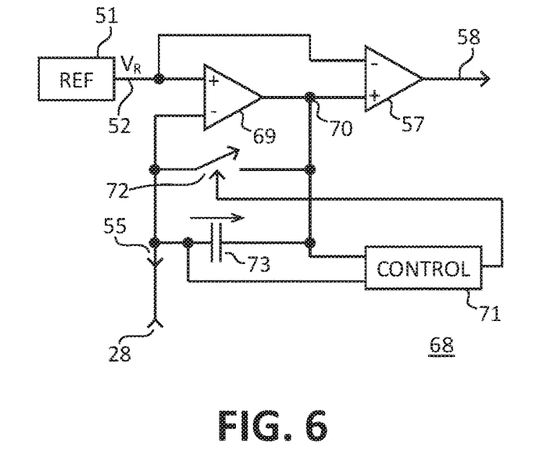
FIG. 6 schematically illustrates a portion of an example of an embodiment of a protection/detection circuit that may have an embodiment that may be an alternate embodiment of any one of the circuits of FIG. 1-2 or 4-5 in accordance with the present invention.

FIG. 6 schematically illustrates a portion of an example of an embodiment of a protection/detection circuit or detect circuit 68 that may have an embodiment that may be an alternate embodiment of any one of circuits 27, 127, 50, or 61. Circuit 68 includes an amplifier 69, a switch 72, a capacitor 73, and a control circuit 71. Some embodiments of circuit 68 may optionally include comparator 57. Circuit 68 is configured to close switch 72 which discharges capacitor 73 and applies voltage $V_R$ 52 to region 14. For example, circuit 71 may be configured to close switch 72. Circuit 68 may have an embodiment that closes switch 72 aperiodically or periodically. Closing switch 72 discharges capacitor 73. For an embodiment that includes diode 44, the value of the voltage applied to region 14 may be $V_R$-V44. Circuit 68 may be configured to thereafter open switch 72. For example, circuit 71 may be configured to negate a control signal to open switch 72. Opening switch 72 causes current 55 to flow from the output of amplifier 69 through capacitor 73 to conductor 28 and region 14. Capacitor 73 integrates current 55 to form a voltage across capacitor 73 that has a value of the integral of current 55 divided by the value of capacitor 73 [∫(I55/C73)(where C73 is the value of capacitor 73)]. Thus, the signal at node 70 increases in response to electrons 59. Circuit 68 may optionally include comparator 57. Comparator 57 asserts detect signal 58 in response to the increased value at node 70, thus, in response to detecting electrons 59. The non-inverting input of the comparator 57 may be connected to other reference voltages instead of to voltage $V_R$ 52.

In order to assist in forming the functionality described for circuit 68, the output of circuit 51 is connected to a non-inverting input of amplifier 69. An inverting input of amplifier 69 is commonly connected to a first terminal of switch 72, a first terminal of capacitor 73, a first input of circuit 71, and to conductor 28. A second terminal of capacitor 73 is commonly connected to a second input of circuit 71, a second terminal of switch 72, to node 70, and to an output of amplifier 69. Circuit 68 may also optionally include comparator 57 having an inverting input connected to the output of circuit 51 and a non-inverting input connected to node 70.

Figure 7:
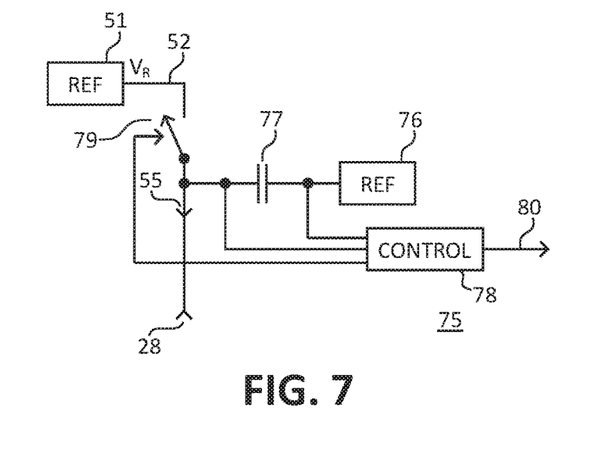
FIG. 7 schematically illustrates a portion of an example of an embodiment of a protection/detection circuit that may have an embodiment that may be an alternate embodiment of any one of the circuits of FIG. 1-2 or 4-6 in accordance with the present invention.

FIG. 7 schematically illustrates a portion of an example of an embodiment of a protection/detection circuit or detect circuit 75 that may have an embodiment that may be an alternate embodiment of any one of circuits 27, 127, 50, 61, or 68. Circuit 75 includes circuit 51, a voltage reference circuit 76, a switch 79, a capacitor 77, and a control circuit 78. Circuit 75 may be configured to close switch 79 periodically or aperiodically. For example, circuit 78 may be configured to periodically assert a control signal that is used to control switch 79. Closing switch 79 supplies voltage $V_R$ 52 to conductor 28 and region 14. For an embodiment that includes diode 44, the value of the voltage applied to region 14 may be $V_R$-V44. Closing switch 79 also forms a voltage across capacitor 77 that is substantially equal to the difference ($V_D$) between voltage $V_R$ 52 and the voltage from circuit 76 ($V_D=V_R$-V76 where V76 is the voltage from circuit 76). Circuit 75 may periodically open switch 79. While switch 79 is open, capacitor 77 supplies current 55 in response to electrons 59. Capacitor 77 integrates current 55 to form a voltage across capacitor 77 that is substantially the difference voltage $V_D$ minus the integral of current 55 divided by the value of capacitor 77 [$V_D$-∫(I55/C77)(where C77 is the value of capacitor 77)]. Circuit 78 may be configured to assert a detect signal 80 in response to the voltage across capacitor 77 having a value less than approximately zero. Thus, circuit 75 may be configured to assert detect signal 80 in response to detecting electrons 59 in region 14. An embodiment of circuit 75 may be configured to assert detect signal 80 in response to the accumulated charge (e.g. integration of current 55) exceeding a threshold.

In order to facilitate this functionality for circuit 75, the output of circuit 51 is connected to a first terminal of switch 79. Switch 79 has a second terminal commonly connected to conductor 28, to a first terminal of capacitor 77, and to a first input of circuit 78. A second terminal of capacitor 77 is commonly connected to the output of circuit 76 and to a second input of circuit 78. A first output of circuit 78 is connected to a control input of switch 79. Circuit 78 has a second output that forms detect signal 80.

Figure 8:
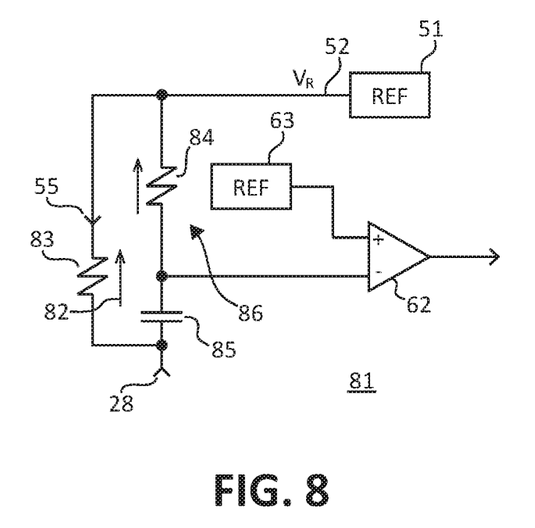
FIG. 8 schematically illustrates a portion of an example of an embodiment of a protection/detection circuit that may have an embodiment that may be an alternate embodiment of any one of the circuits of FIG. 1-2 or 4-7 in accordance with the present invention.

FIG. 8 schematically illustrates a portion of an example of an embodiment of a protection/detection circuit or detect circuit 81 that may have an embodiment that may be an alternate embodiment of any one of circuits 27, 127, 50, 61, 68, or 75. Circuit 81 includes circuit 51, connected to a resistor 83 that is configured to apply a voltage to conductor 28 and region 14. Circuit 81 also includes a capacitor 85 a resistor 84, a comparator 62, and circuit 63. Circuit 51 is configured to apply voltage $V_R$ 52 to region 14 through conductor 28 and resistor 83. For the embodiment that includes diode 44, circuit 81 applies a voltage of $V_R$-V44. In response to electrons 59, current 55 flows from circuit 51 through resistor 83 which forms a sense voltage 82 across resistor 83. Capacitor 85 and resistor 84 are configured as a high pass filter 86 that substantially prevents low-frequency components of voltage 82 from propagating to a voltage across resistor 84. As voltage 82 increases, the voltage across resistor 84 also increases which decreases the voltage at the inverting input of comparator 62 thereby asserting the output of comparator 62. Thus, circuit 81 detects electrons 59 by asserting the output of comparator 62. An embodiment of circuit 81 may be configured to detect variations of current 55 that are greater in frequency than the cut-off frequency of filter 86.

In order to facilitate the functionality described for circuit 81, a first terminal of resistor 83 is commonly connected to conductor 28 and to a first terminal of capacitor 85. A second terminal of resistor 83 is commonly connected to the output of circuit 51 and to a first terminal of resistor 84. A second terminal of resistor 84 is commonly connected to a second terminal of capacitor 85 and to an inverting input of comparator 62. A non-inverting input of comparator 62 is connected to the output of circuit 63.

Figure 9:
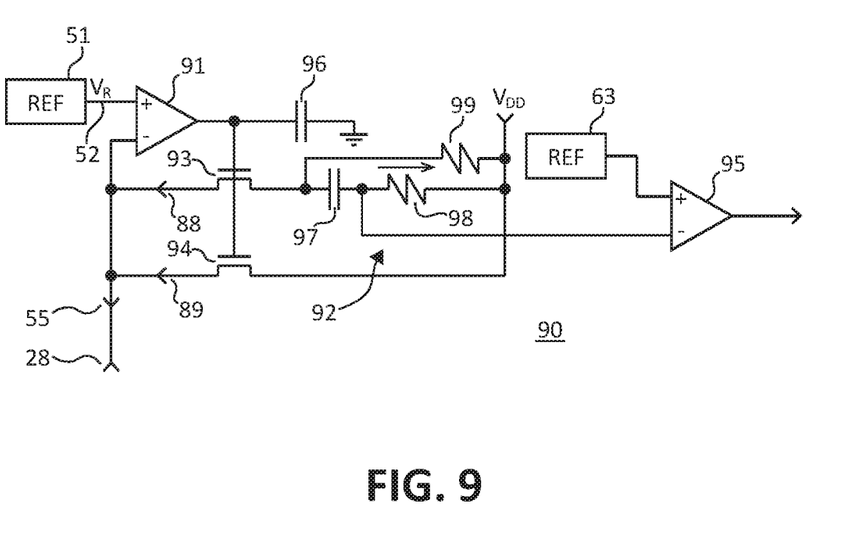
FIG. 9 schematically illustrates a portion of an example of an embodiment of a protection/detection circuit that may have an embodiment that may be an alternate embodiment of any one of the circuits of FIG. 1-2 or 4-8 in accordance with the present invention.

FIG. 9 schematically illustrates a portion of an example of an embodiment of a protection/detection circuit or detect circuit 90 that may have an embodiment that may be an alternate embodiment of any one of circuits 27, 127, 50, 61, 68, 75, or 81. Circuit 90 includes circuits 51 and 63. Circuit 90 additionally includes an amplifier 91, a comparator 95, transistors 93 and 94, capacitors 96 and 97, and resistors 98 and 99. Amplifier 91 and transistors 93 and 94 are configured in a follower configuration where the output of amplifier 91 controls transistors 93 to 94 to form a voltage on conductor 28 that is substantially equal to voltage $V_R$ 52. Transistor 94 receives a voltage, such as a supply voltage $V_{dd}$, and supplies a current 89 to conductor 28 as a portion of current 55. Transistor 93 has an active area that is ratioed to the active area of transistor 94 such that transistor 93 conducts a current 88 that is proportional to current 89 by the ratio of the active areas of transistors 93 and 94. Current 88 forms an additional portion of current 55. Current 88 flows through resistor 99 and forms a voltage across resistor 99. Capacitor 97 and resistor 98 functions as a high pass filter 92 similar to the configuration filter 86 (FIG. 8). As the voltage across resistor 99 increases, the voltage across resistor 98 also increases which decreases the voltage at the inverting input of comparator 95. Decreasing the voltage at the inverting input of comparator 95 causes comparator 95 to assert the output of comparator 95. Thus, circuit 90 detects electrons 59 by asserting the output of comparator 95. An embodiment of circuit 90 may be configured to detect variations of current 55 that are greater in frequency than the cut-off frequency of filter 92.

In order to facilitate the functionality described for circuit 90, a non-inverting input of amplifier 91 is connected to the output of circuit 51. An inverting input of amplifier 91 is commonly connected to conductor 28, to a source of transistor 94, and to a source of transistor 93. An output of amplifier 91 is commonly connected to a first terminal of capacitor 96, to a gate of transistor 93, and to a gate of transistor 94. A second terminal of capacitor 96 is commonly connected to a common reference such as for example a ground reference. A drain of transistor 94 is connected to receive the voltage from the power supply. A drain of transistor 93 is commonly connected to a first terminal of capacitor 97 and to a first terminal of resistor 99. A drain of transistor 94 is commonly connected to a first terminal of resistor 98, a second terminal of resistor 99, and to receive these power supply voltage. Terminal of resistor 98 is commonly connected to a second terminal of capacitor 97 and to an inverting input of comparator 95. A non-inverting input of comparator 95 is connected to the output of circuit 63.

Figure 10:
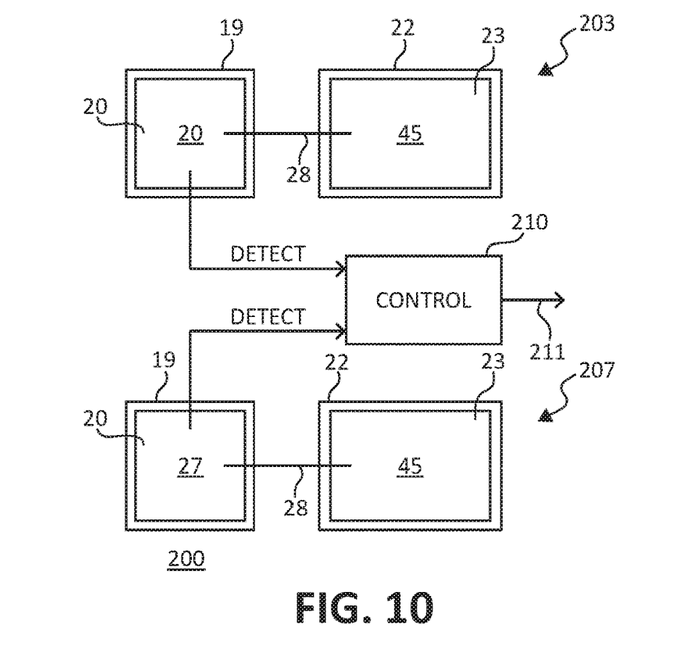
FIG. 10 functionally illustrates a portion of an example of an embodiment of semiconductor device that may have an embodiment that includes one or more of the circuits of FIG. 1-2 or 4-9 in accordance with the present invention.

FIG. 10 functionally illustrates a block diagram of a portion of an example of an embodiment of semiconductor device 200 that may have an embodiment that includes a circuit 203 and a circuit 207. Each of circuits 203 and 207 include circuits 27 and 45. Device 200 also includes a control circuit 210. One of circuits 203 or 207 may be used as a reference circuit and the other may be used as a test circuit. Circuit 210 is configured to receive the detect signal from both circuits 27. Circuit 210 may be configured to detect an error if one circuit 27 asserts the detect signal and the other one does not. For example, circuit 210 may be configured to disregard the output of at least one of circuits 45.

In an alternate embodiment, suppose that one of circuits 203 or 207 is shielded to prevent the external influence. It may be considered an error if the unshielded circuit 27 asserts the detect signal and the shielded circuit 27 does not assert the detect signal. For example, the shielded circuit provides a clean detect signal that may indicate that the unshielded circuit is incorrect.

Figure 11:
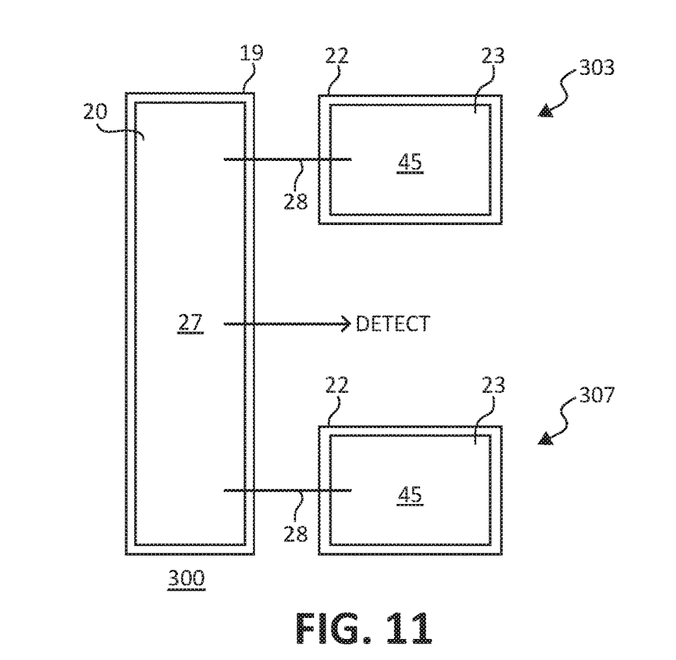
FIG. 11 functionally illustrates a block diagram of a portion of an example of an embodiment of semiconductor device that may have an embodiment that includes one or more of the circuits of FIG. 1-2 or 4-9 in accordance with the present invention.

FIG. 11 functionally illustrates a block diagram of a portion of an example of an embodiment of semiconductor device 300 that may have an embodiment that includes a circuit 303 and a circuit 307. Each of circuits 303 and 307 include circuit 45 and conductor 28. Device 300 also includes one detection circuit 27 or alternately circuit 90 connected to each conductor 28 of each circuit 303 and 307. One of circuits 303 or 307 may be used as a reference circuit and the other may be used as test circuit. Those skilled in the art may appreciate that the reference circuit and the test circuit may substantially have a similar functionality. Circuit 27 is configured to receive electrons 59 flowing from region 14 of circuit 303 as well as electrons 59 flowing from region 14 of circuit 307. Circuit 27 may be configured to detect an error if current 55 flowing in one conductor 28 (e.g. of circuit 303) exceeds current 55 flowing in the other conductor 28 (e.g. of circuit 307) by a certain amount. In other words, circuit 27 may assert the detect output when the difference between both currents 55 exceeds a certain threshold. Thus, circuit 300 is sensitive to a difference between current 55 from circuits 303 and 307.

Circuit 27 may be configured to issue a warning if it asserts the detect signal. In an alternate embodiment, circuit 27 may be configured to indicate via the detect output which one of circuits 303 and 307 is receiving an excess current 55, and may determine which one of circuits 303 or 307 is expected to operate more reliably. In an alternate embodiment, the detect output may be used to select the output of the circuit deemed to be most reliable.

Circuit 27 and any of the herein explained alternate embodiments thereof may be used for other applications. Circuit 27 may also be used as an infra-red sensor to detect electrons formed by infra-red energy that forms electrons 59. Circuit 27 and any of the herein explained alternate embodiments thereof may also be used underlying the active region of a photo-diode, or group of photo diodes, to prevent external influences from affecting the operation of the photo-diode(s). Circuit 27 and any of the herein explained alternate embodiments thereof may alternately be configured as a light sensor or alternately a radiation sensor wherein electrons 59 may be formed in response to light or radiation. Alternately, circuit 27 may include region 32 and circuit 27 may be configured to sense neutrons that impinge on region 32 and form electrons 59.

From all the foregoing, those skilled in the art will appreciate that an example of an embodiment of a protection circuit of a semiconductor device may comprise:

a semiconductor substrate, such as for example substrate 13;

a first doped layer, such as for example region 14, of a first conductivity type, such as for example N-type, on the semiconductor substrate;

a second doped layer, such as for example region 16, of a second conductivity type, such as for example P-type, on the first doped layer, the second doped layer having a surface, such as for example surface 18, opposite to the semiconductor substrate;

a first isolation structure, such as for example structure 22, surrounding a first perimeter of a first active region, such as for example region 23, of the first doped layer and the second doped layer, the first isolation structure extending substantially perpendicularly from the surface through the second doped layer, through the first doped layer, and into the semiconductor substrate;

a first P-N junction, such as for example diode 41, within the first active region, the first P-N junction formed at an interface, such as for example interface 40, between the first doped layer, and the second doped layer, the first P-N junction having a first depletion region, such as for example region 34;

active circuits, such as for example circuit 46, on the second doped layer within the first active region, the active circuits having a second P-N junction, the second P-N junction having a second depletion region, such as for example region 47, overlying at least a portion of the first P-N junction;

a second isolation structure, such as for example structure 19, surrounding a second perimeter of a second active region, such as for example region 20, of the first doped layer and the second doped layer, the second isolation structure extending from the surface through the second doped layer, through the first doped layer, and into the semiconductor substrate wherein the second isolation structure substantially isolates the second active region from lateral current flow through the second doped layer to the first active region;

a sensing circuit, such as for example circuit 27, formed on the second doped layer and within the second active region, the sensing circuit configured to apply a voltage to the first doped layer that is within the first active region wherein the voltage expands the first depletion region toward the second depletion region but substantially does not intersect the second depletion region; and the sensing circuit configured to detect electrons within the first doped layer and to responsively assert a detection signal representing detection of the electrons wherein the sensing circuit detects the electrons while applying the voltage to the first doped layer.

An embodiment may include that the sensing circuit includes a regulator circuit, such as for example circuit 50, configured to apply the voltage and to detect a sense voltage, such as for example voltage 56, responsively to current, such as for example current 55, formed by the electrons.

An embodiment of the sensing circuit may include a comparator, such as for example comparator 62, having a first input coupled to receive a first reference voltage, such as for example voltage from 63, from an output of a first reference circuit, and a second input coupled to detect a sense voltage formed responsively to current, such as for example current 55, that is formed by the electrons.

Another embodiment may include a resistor, such as for example resistor 64, coupled to apply the voltage to the first doped layer, the resistor coupled in series between an output of a second reference circuit and the second input of the comparator.

An embodiment may include a resistor, such as for example resistor 64, coupled to apply the voltage to the first doped layer, the resistor coupled in series between an output of a second reference circuit, such as for example circuit 51, and the first doped layer; and a filter circuit coupled to the first doped layer to filter, or alternately to substantially remove, frequencies less than approximately a cut-off frequency of the filter circuit.

An embodiment of the protection circuit may include a capacitor coupled in series between the first doped layer and the second input of the comparator, the filter circuit also including another resistor coupled in series between the second input of the comparator and the output of the first reference circuit.

In an embodiment, the sensing circuit may include an integrator circuit, such as for example circuit 68, having a switch, such as for example switch 72, and a capacitor, the integrator circuit configured to discharge the capacitor and to apply the voltage to the first doped layer in response to a closed state of the switch and to integrate current formed by the electrons in response to an open state of the switch.

The protection circuit may have an embodiment wherein the integrator circuit includes an amplifier having a first input coupled to receive a reference voltage from a reference circuit, and a second input coupled to the first doped layer wherein the capacitor is coupled between the second input and an output of the amplifier and wherein the switch is coupled between the second input and the output of the amplifier.

An embodiment of the sensing circuit may be configured to apply the voltage to the first doped layer through a diode, such as for example diode 44.

Those skilled in the art will also appreciate that an example of an embodiment of a semiconductor device may comprise:

a semiconductor substrate, such as for example substrate 11, having a first doped region, such as for example region 14, of a first conductivity type, such as for example N-type;

a second doped region, such as for example region 16, of a second conductivity type, such as for example P-type, on the first doped region, the second doped region having a surface, such as for example surface 18, opposite to the semiconductor substrate;

a first isolation structure, such as for example structure 22, surrounding a first perimeter of a first portion of the first doped region and the second doped region and forming a first active region, such as for example region 23, within the first portion including forming the first isolation structure extending from the surface through the second doped region, through the first doped region, and into the semiconductor substrate;

a first P-N junction, such as for example diode 41, within the first active region, the first P-N junction formed at an interface, such as for example interface 40, between the first doped region (NBL/14, and the second doped region, the first P-N junction having a first depletion region, such as for example region 34;

active circuits, such as for example circuit 46, on the second doped region within the first active region, the active circuits having a second P-N junction, the second P-N junction having a second depletion region, such as for example region 47, overlying at least a portion of the first P-N junction;

a sensing circuit, such as for example circuit 27, formed on the second doped region, such as for example region 16, the sensing circuit configured to apply a voltage to the first doped region that expands the first depletion region toward the second depletion region wherein the first depletion region substantially does not intersect the second depletion region; and the sensing circuit configured to detect electrons formed within the first doped region and to responsively assert a detection signal representing detection of the electrons wherein the sensing circuit detects the electrons while applying the voltage to the first doped region.

An embodiment of the semiconductor device may include that the second doped region has a first dopant concentration approximately at the interface and has a third doped region having a second dopant concentration a first distance from the interface wherein the second dopant concentration is greater than the first dopant concentration and wherein the third doped region underlies the second depletion region by a second distance the second distance along a line substantially perpendicular to the surface.

In an embodiment, the sensing circuit may be configured to apply the voltage at a value that expands the first depletion region to the third doped region but not beyond the third doped region.

The semiconductor device may have an embodiment that may include a second isolation structure, such as for example structure 19, surrounding a second perimeter of a second active region, such as for example region 20, of the first doped region, the second isolation structure extending from the surface through the second doped region, through the first doped region, and into the semiconductor substrate wherein the second isolation structure substantially isolates the second active region from lateral current flow through the second doped region to the first active region.

An embodiment of the sensing circuit may be formed on the second doped region and within the second active region.

Those skilled in the art will appreciate that an example of an embodiment of a method of forming a semiconductor device may comprise:

forming a first doped region, such as for example region 16, of a first conductivity type, such as for example P-type, contacting a second doped region, such as for example region 14, of a second conductivity type, such as for example N-type, including forming a first P-N junction at an interface of the first doped region and the second doped region, the first P-N junction having a first depletion region, such as for example region 34;

forming a functional circuit, such as for example circuit 45, on the first doped region wherein the functional circuit has a second depletion region;

forming a sensing circuit, such as for example circuit 27, to apply a voltage to the second doped region wherein the voltage expands the first depletion region toward the second depletion region but substantially does not intersect the second depletion region; and configuring the sensing circuit to detect electrons formed within the second doped region and to responsively assert a detection signal representing detection of the electrons wherein the sensing circuit detects the electrons while applying the voltage to the second doped region.

An embodiment of the method may include forming a first isolation structure, such as for example structure 22, surrounding a first portion of the first doped region and the second doped region, and forming the sensing circuit within the first portion.

An embodiment may also include forming the functional circuit within the first portion.

The method may have an embodiment that may include forming a second isolation structure, such as for example structure 20, surrounding a second portion of the first doped region and the second doped region, and forming the functional circuit within the second portion wherein the sensing circuit applies the voltage to the second portion of the second doped region.

An embodiment may include forming the first isolation structure to surround a first portion of the first P-N junction.

An embodiment of the method may include forming the sensing circuit with an input impedance that is no less than approximately one hundred thousand ohms.

In view of all of the above, it is evident that a novel device and method is disclosed. Included, among other features, is forming a device that can detect the presence of electrons within a layer of the device. Signaling the detection of the electrons allows other functional devices to mitigate improper operation that could be caused by external influences that generate the electrons. Forming the sensing circuit to detect the electrons facilitates forming the sensing circuit on the same die with functions circuits, thus, co-integrating the sensing and functional circuits. Forming the sensing circuit to sense electrons formed in regions underlying the functional circuits also facilitates the co-integration, forming part of the circuit underlying the functional circuits also facilitates reducing the area used for the circuits which results in reducing costs.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A protection circuit of a semiconductor device comprising:
    a semiconductor substrate;
    a first doped layer of a first conductivity type on the semiconductor substrate;
    a second doped layer of a second conductivity type on the first doped layer, the second doped layer having a surface opposite to the semiconductor substrate;
    a first isolation structure surrounding a first perimeter of a first active region of the first doped layer and the second doped layer, the first isolation structure extending substantially perpendicularly from the surface through the second doped layer, through the first doped layer, and into the semiconductor substrate;
    a first P-N junction within the first active region, the first P-N junction formed at an interface between the first doped layer and the second doped layer, the first P-N junction having a first depletion region;
    active circuits on the second doped layer within the first active region, the active circuits having a second P-N junction, the second P-N junction having a second depletion region overlying at least a portion of the first P-N junction;
    a second isolation structure surrounding a second perimeter of a second active region of the first doped layer and the second doped layer, the second isolation structure extending from the surface through the second doped layer, through the first doped layer, and into the semiconductor substrate wherein the second isolation structure substantially isolates the second active region from lateral current flow through the second doped layer to the first active region;
    a sensing circuit formed on the second doped layer and within the second active region, the sensing circuit configured to apply a voltage to the first doped layer that is within the first active region wherein the voltage expands the first depletion region toward the second depletion region but substantially does not intersect the second depletion region; and
    the sensing circuit configured to detect electrons within the first doped layer and to responsively assert a detection signal representing detection of the electrons wherein the sensing circuit detects the electrons while applying the voltage to the first doped layer.

2. The protection circuit of claim 1 wherein the sensing circuit includes a regulator circuit configured to apply the voltage and to detect a sense voltage responsively to current formed by the electrons.

3. The protection circuit of claim 1 wherein the sensing circuit includes a comparator having a first input coupled to receive a first reference voltage from an output of a first reference circuit, and a second input coupled to detect a sense voltage formed responsively to current that is formed by the electrons.

4. The protection circuit of claim 3 further including a resistor coupled to apply the voltage to the first doped layer, the resistor coupled in series between an output of a second reference circuit and the second input of the comparator.

5. The protection circuit of claim 3 further including a resistor coupled to apply the voltage to the first doped layer, the resistor coupled in series between an output of a second reference circuit and the first doped layer; and
    a filter circuit coupled to the first doped layer to substantially remove frequencies less than approximately a cut-off frequency of the filter circuit.

6. The protection circuit of claim 5 wherein the filter circuit includes a capacitor coupled in series between the first doped layer and the second input of the comparator, the filter circuit also including another resistor coupled in series between the second input of the comparator and the output of the first reference circuit.

7. The protection circuit of claim 1 wherein the sensing circuit includes an integrator circuit having a switch and a capacitor, the integrator circuit configured to discharge the capacitor and to apply the voltage to the first doped layer in response to a closed state of the switch and to integrate current formed by the electrons in response to an open state of the switch.

8. The protection circuit of claim 7 wherein the integrator circuit includes an amplifier having a first input coupled to receive a reference voltage from a reference circuit, and a second input coupled to the first doped layer wherein the capacitor is coupled between the second input and an output of the amplifier and wherein the switch is coupled between the second input and the output of the amplifier.

9. The protection circuit of claim 1 wherein the sensing circuit is configured to apply the voltage to the first doped layer through a diode.

10. A semiconductor device comprising:
a semiconductor substrate having a first doped region of a first conductivity type;
a second doped region of a second conductivity type on the first doped region, the second doped region having a surface opposite to the semiconductor substrate;
a first isolation structure surrounding a first perimeter of a first portion of the first doped region and the second doped region and forming a first active region within the first portion including forming the first isolation structure extending from the surface through the second doped region, through the first doped region, and into the semiconductor substrate;
a first P-N junction within the first active region, the first P-N junction formed at an interface between the first doped region and the second doped region, the first P-N junction having a first depletion region;
active circuits on the second doped region within the first active region, the active circuits having a second P-N junction, the second P-N junction having a second depletion region overlying at least a portion of the first P-N junction;
a sensing circuit formed on the second doped region, the sensing circuit configured to apply a voltage to the first doped region that expands the first depletion region toward the second depletion region wherein the first depletion region substantially does not intersect the second depletion region; and
the sensing circuit configured to detect electrons formed within the first doped region and to responsively assert a detection signal representing detection of the electrons wherein the sensing circuit detects the electrons while applying the voltage to the first doped region.

11. The semiconductor device of claim 10 wherein the second doped region has a first dopant concentration approximately at the interface and has a third doped region having a second dopant concentration a first distance from the interface wherein the second dopant concentration is greater than the first dopant concentration and wherein the third doped region underlies the second depletion region by a second distance the second distance along a line substantially perpendicular to the surface.

12. The semiconductor device of claim 11 wherein the sensing circuit is configured to apply the voltage at a value that expands the first depletion region to the third doped region but not beyond the third doped region.

13. The semiconductor device of claim 10 further including a second isolation structure surrounding a second perimeter of a second active region of the first doped region, the second isolation structure extending from the surface through the second doped region, through the first doped region, and into the semiconductor substrate wherein the second isolation structure substantially isolates the second active region from lateral current flow through the second doped region to the first active region.

14. The semiconductor device of claim 13 wherein the sensing circuit is formed on the second doped region and within the second active region.

* * * * *